(12) United States Patent
Cheng et al.

(10) Patent No.: US 12,295,080 B2
(45) Date of Patent: May 6, 2025

(54) FAULT DIAGNOSIS APPARATUS AND METHOD

(71) Applicant: Diodes Incorporated, Plano, TX (US)

(72) Inventors: Dongjie Cheng, Murphy, TX (US); Harish Raikar, Belagavi (IN); Arvind Patil, Hubballi (IN); Akshay Panchamukhi, Hubballi (IN)

(73) Assignee: Diodes Incorporated, Plano, TX (US)

( * ) Notice: Subject to any disclaimer, the term of this patent is extended or adjusted under 35 U.S.C. 154(b) by 295 days.

(21) Appl. No.: 18/055,555

(22) Filed: Nov. 15, 2022

(65) Prior Publication Data

US 2024/0163995 A1 May 16, 2024

(51) Int. Cl.
*H05B 45/54* (2020.01)
*G01R 31/26* (2020.01)
*H05B 45/325* (2020.01)

(52) U.S. Cl.
CPC ......... *H05B 45/54* (2020.01); *G01R 31/2635* (2013.01); *H05B 45/325* (2020.01)

(58) Field of Classification Search
CPC ...... H05B 45/54; H05B 45/32; H05B 45/325; G01R 31/26; G01R 31/2635; G01R 31/2621; G01R 31/2632; G01R 31/2831
See application file for complete search history.

(56) References Cited

U.S. PATENT DOCUMENTS

| | | | |
|---|---|---|---|
| 10,129,941 B1 | 11/2018 | Navabi-Shirazi et al. | |
| 2005/0185353 A1 | 8/2005 | Rasmussen et al. | |
| 2008/0074348 A1 | 3/2008 | Kao | |
| 2011/0007437 A1 | 1/2011 | Kataoka | |
| 2013/0076252 A1 | 3/2013 | Shao et al. | |
| 2014/0168567 A1* | 6/2014 | Kikuchi | H05B 45/14 349/61 |
| 2016/0270177 A1 | 9/2016 | Mishima | |
| 2018/0168013 A1 | 6/2018 | Kikuchi et al. | |
| 2019/0348980 A1* | 11/2019 | Hayashi | H03K 17/08128 |
| 2021/0076465 A1 | 3/2021 | Aoki et al. | |
| 2021/0227659 A1 | 7/2021 | Chang et al. | |

FOREIGN PATENT DOCUMENTS

| | | |
|---|---|---|
| CN | 204145828 U | 2/2015 |
| CN | 207410218 U | 5/2018 |
| CN | 112996189 A | 6/2021 |
| CN | 113514748 A | 10/2021 |
| JP | 2009194182 A | 8/2009 |
| JP | 2018098165 A | 6/2018 |
| JP | 2020068072 A | 4/2020 |
| JP | 2021136127 A | 9/2021 |
| TW | I710206 B * | 11/2020 |

OTHER PUBLICATIONS

Extended European Search Report for European Application No. 23186819.1, mailed Apr. 2, 2024, 12 pages.
Office Action and Search Report from Taiwan Patent Application No. 112104710, dated Dec. 14, 2023, 6 pages.
Office Action for Japanese Patent Application No. 2023-121830, mailed on Aug. 23, 2024, 17 pages.

* cited by examiner

*Primary Examiner* — Son T Le
(74) *Attorney, Agent, or Firm* — AP3 Law Firm PLLC; Li Li

(57) ABSTRACT

An apparatus includes a clamping circuit configured to provide a predetermined voltage at an output of the clamping circuit, a clamping switch coupled to the output of the clamping circuit, and a pass device connected between the clamping switch and an input/output terminal of a controller.

21 Claims, 13 Drawing Sheets

FAULT DIAGNOSIS APPARATUS AND METHOD

TECHNICAL FIELD

Embodiments of the invention are related to a fault diagnosis apparatus, and more particularly, to a fault diagnosis apparatus in a light emitting diode system.

BACKGROUND

A light emitting diode (LED) is a semiconductor light source. When a voltage is applied to the LED, a current flows through the LED. In response to the current flowing through the LED, electrons and holes recombine in the PN Junction of the diode. In the recombination process, energy is released in the form of photons.

A typical LED system comprises a plurality of LED strings. Each LED string comprises a plurality of light-emitting diodes, a power switch and a current sense resistor connected in series between a power source and ground. The LED system further comprises a PWM controller. In operation, the PWM controller is configured to receive a PWM signal generated by a system controller (e.g., a microcontroller) and a voltage across the current sense resistor. Based on the received signals, the PWM controller is configured to generate a gate drive signal applied to a gate of the power switch. The gate drive signal is controlled such that an average current flowing through the plurality of light-emitting diodes is adjustable based different operating requirements. The process of controlling the LED average current is often termed as dimming.

Pulse width modulation (PWM) is a commonly used control technique that generates analog signals from digital devices such as microcontrollers. In a typical PWM controller system, a microcontroller communicates and/or interfaces with semiconductor integrated circuits (e.g., a PWM controller) in one or multiple protocols. The LED system also usually includes a hardware fault detection mechanism. Once a fault is detected, the PWM controller reports the fault to the microcontroller through various communication methods. The simplest communication method is one wire communication in which the microcontroller and the PWM controller exchange information through a single wire. The single wire commination can be categorized as a unidirectional communication system in which the microcontroller sends instructions to the PWM controller, and the PWM controller executes the instructions. Another communication method is based on a bidirectional communication system in which both the microcontroller and the PWM controller can send and receive instructions. The bidirectional communication system can be obtained by using suitable protocols such as I2C, SPI, UART, any combinations thereof and the like. In some applications, a fault flag pin is another popular alternative. The fault flag pin is employed to show the fault status of the PWM controller. Through reading the fault status provided by the fault flag pin, the microcontroller is able to determine whether a fault occurs in the LED system.

The communication methods described above are effective. However, the implementations of these communication methods cause a complex and expensive system. Such a complex and expensive system has many shortcomings such as lack of design flexibility, poor reliability and the like. It would be desirable to have a simple fault diagnosis apparatus through which the system controller can reliably determine the fault status of the LED system. This disclosure describes a simple and cost-efficient apparatus for determining the fault status of the LED system.

SUMMARY

These and other problems are generally solved or circumvented, and technical advantages are generally achieved, by preferred embodiments of the present disclosure which provide a fault diagnosis apparatus and method in an LED system.

In accordance with an embodiment, an apparatus comprises a clamping circuit configured to provide a predetermined voltage at an output of the clamping circuit, a clamping switch coupled to the output of the clamping circuit, and a pass device connected between the clamping switch and an input/output terminal of a controller.

In accordance with another embodiment, a method comprises configuring a microcontroller to generate a PWM signal fed into a PWM terminal of a controller of a light emitting diode (LED) system, detecting a fault event in the LED system, and in response to the fault event in the LED system, clamping a logic high voltage of the PWM signal to a predetermined level through a clamping apparatus.

In accordance with yet another embodiment, a system comprises a plurality of light emitting diodes connected in series between an input voltage bus and a power switch, a PWM controller configured to generate a gate drive signal fed into a gate of the power switch, and a fault diagnosis circuit coupled to a PWM terminal of the PWM controller, wherein the fault diagnosis circuit comprises a clamping circuit configured to provide a predetermined voltage at an output of the clamping circuit, a clamping switch coupled to the output of the clamping circuit, and a pass device connected between the clamping switch and an input/output terminal of the PWM controller.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a fault diagnosis apparatus in an LED system. The disclosure may also be applied, however, to a variety of electronic systems. Hereinafter, various embodiments will be explained in detail with reference to the accompanying drawings.

Figure 1:
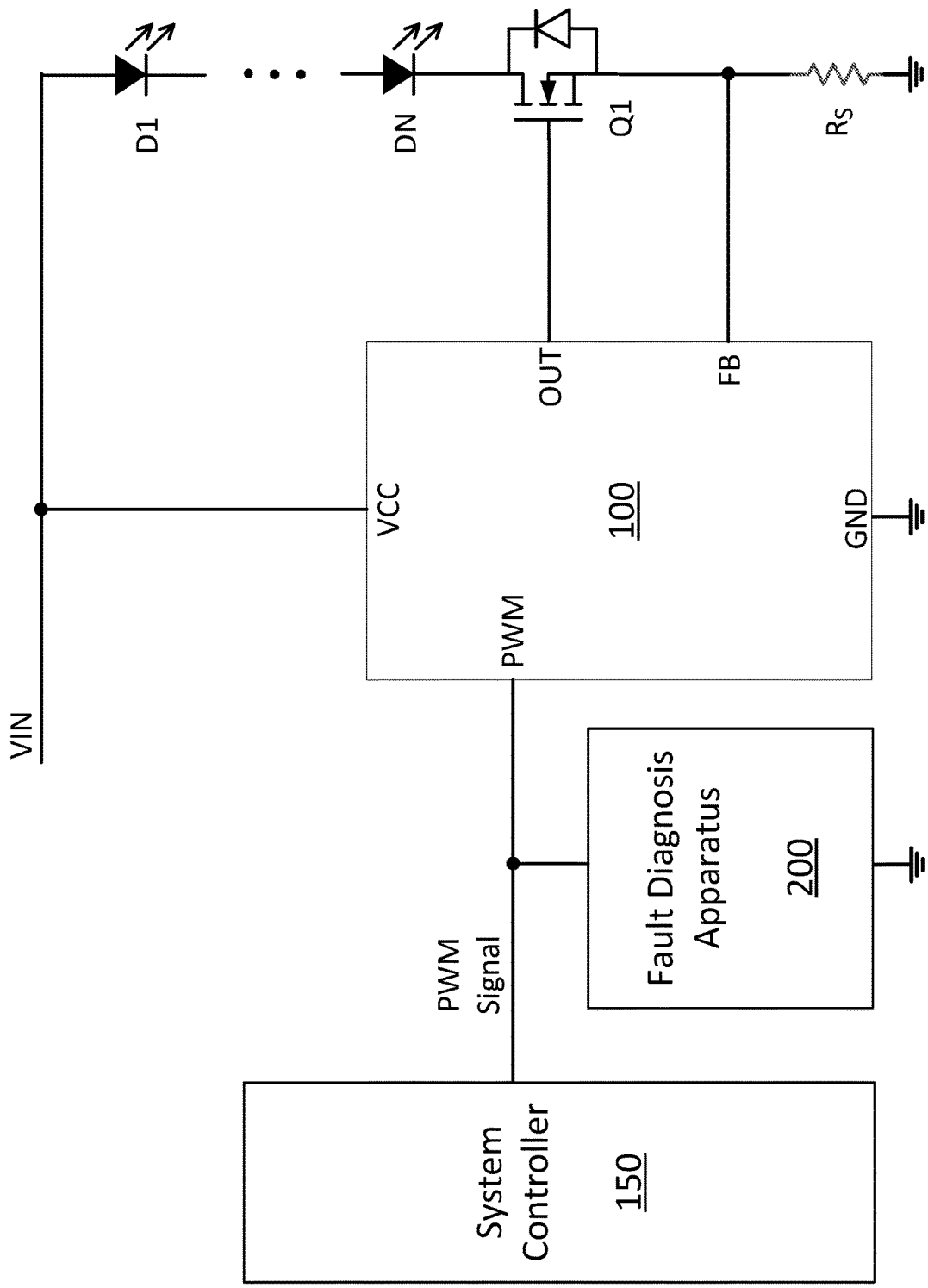
FIG. 1 illustrates a block diagram of a light emitting diode system in accordance with various embodiments of the present disclosure.

FIG. 1 illustrates a block diagram of a light emitting diode system in accordance with various embodiments of the present disclosure. A plurality of light emitting diodes D1-DN, a power switch Q1 and a current sense resistor $R_S$ are connected in series between an input voltage bus VIN and ground. As shown in FIG. 1, a PWM controller 100 has a bias voltage terminal VCC connected to the input voltage bus VIN, a PWM terminal configured to receive a PWM signal generated by a system controller 150, a ground terminal GND connected to ground, a feedback terminal FB connected to the common node of $R_S$ and Q1, and an output terminal OUT connected to a gate of Q1.

In operation, the PWM controller 100 is configured to generate a gate drive signal for controlling the turn-on and turn-off of Q1 so as to control the average current flowing through the plurality of light emitting diodes D1-DN.

As shown in FIG. 1, the light emitting diode system further comprises a fault diagnosis apparatus 200 coupled between the PWM terminal and ground. In operation, the fault diagnosis apparatus 200 functions as a fault status-reporting device. More particularly, when a fault (e.g., an open load fault, a short-circuit to ground fault, a short-circuit to VIN fault, a thermal shutdown and the like) occurs, the fault diagnosis apparatus 200 is able to change the logic high voltage of the PWM signal so that the system controller 150 is able to determine the fault status of the LED system based on the logic high voltage change. In some embodiments, once the fault occurs, the fault diagnosis apparatus 200 is able to reduce the logic high voltage of the PWM signal from a first logic high voltage (e.g., 4 V) to a second logic high voltage (e.g., 3 V). In response to this logic high voltage change, the system controller 150 is able to find that a fault has occurred in the LED system. The detailed structure and operating principle of the fault diagnosis apparatus 200 will be described below with respect to FIGS. 2-12.

In some embodiments, the system controller 150, the fault diagnosis apparatus 200 and the PWM controller 100 are integrated in one integrated circuit. In alternative embodiments, the system controller 150, the fault diagnosis apparatus 200 and the PWM controller 100 may be implemented in three separate integrated circuits.

It should be noted that the light emitting diode system shown in FIG. 1 is merely an example. Depending on different applications and design needs, the system configuration may vary accordingly. For example, the current sense resistor $R_S$ may be placed between the plurality of light emitting diodes and the power switch Q1. Furthermore, while FIG. 1 illustrates the light emitting diode with one LED string, the light emitting diode could accommodate any number of LED strings.

In some embodiments, the system controller 150 is implemented as a microcontroller. In alternative embodiments, the system controller 150 may be implemented as any suitable processors such as digital signal processing (DSP) controllers, field-programmable gate array (FPGA) processors and the like.

Figure 2:
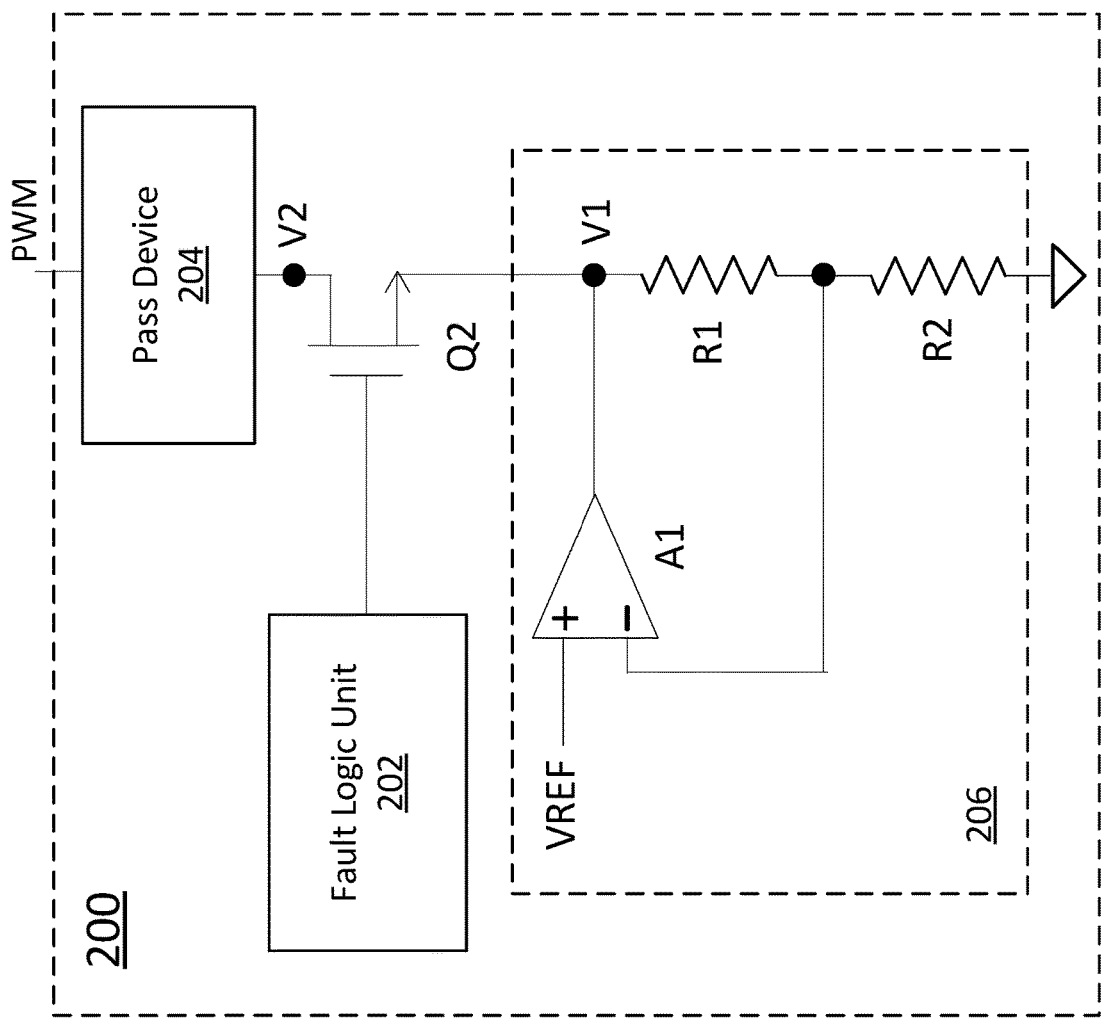
FIG. 2 illustrates a schematic diagram of a first implementation of the fault diagnosis apparatus shown in FIG. 1 in accordance with various embodiments of the present disclosure.

FIG. 2 illustrates a schematic diagram of a first implementation of the fault diagnosis apparatus shown in FIG. 1 in accordance with various embodiments of the present disclosure. The fault diagnosis apparatus 200 comprises a fault logic unit 202, a pass device 204, a clamping switch Q2 and a clamping circuit 206. As shown in FIG. 2, the pass device 204, the clamping switch Q2 and the clamping circuit 206 are connected in series. More particularly, the pass device 204 is connected between an input/output terminal (e.g., the PWM terminal shown in FIG. 1) of an integrated circuit (e.g., the PWM controller 100 shown in FIG. 1) and the clamping switch Q2. The clamping switch Q2 is coupled between the pass device 204 and an output of the clamping circuit 206. The clamping circuit 206 is configured to provide a predetermined voltage at the output of the clamping circuit 206.

As shown in FIG. 2, the clamping circuit 206 comprises an operation amplifier A1, a first resistor R1 and a second resistor R2. A non-inverting input of the operation amplifier A1 is connected to a predetermined reference VREF. An inverting input of the operation amplifier A1 is connected to a common node of the first resistor R1 and the second resistor R2. The first resistor R1 and the second resistor R2 are connected in series between an output of the operation amplifier A1 and ground. As shown in FIG. 2, the output of the operation amplifier A1 is the output of the clamping circuit 206.

The fault logic unit 202 has an output connected to the gate of the clamping switch Q2. In operation, the fault logic unit 202 is configured to detect a fault such as an open load fault, a short-circuit to ground fault, a short-circuit to VIN fault, a thermal shutdown and the like. Based on the detected fault, the fault logic unit 202 is able to generate a signal to turn on the clamping switch Q2. In some embodiments, the signal from the fault logic unit 202 may also be used to enable the operation amplifier A1.

In operation, once the operation amplifier A1 is enabled, the voltage at the inverting input of the operation amplifier A1 is equal to VREF. According to the operating principle of the voltage divider, the voltage (V1) at the output of the operation amplifier A1 can be expressed by the following equation:

$$V1 = VREF \times \left(1 + \frac{R1}{R2}\right) \quad (1)$$

In some embodiments, the clamping switch Q2 is fully turned on once the fault occurs. After the clamping switch Q2 is fully turned on, V2 shown in FIG. 2 is equal to V1.

In normal operation, the PWM signal fed into the PWM terminal is of a logic high voltage (e.g., 4 V) and a logic low voltage (e.g., 0 V). When a fault occurs, the operation amplifier A1 is enabled, and the clamping switch Q2 is turned on. The voltage on the node V2 is equal to the voltage V1 in Equation (1). The pass device 204 may be implemented as a diode (e.g., D1 shown in FIG. 6). When a logic high voltage is on the PWM terminal, the clamping circuit 206, the clamping switch Q2 and the pass device 204 are configured such that a logic high voltage on the PWM terminal is clamped to a predetermined set point. In some embodiments, the predetermined set point is equal to the voltage on the node V2 plus a forward voltage drop of the diode in the pass device 204. The clamped logic high voltage is less than the logic high voltage in normal operation. On the other hand, when a logic low voltage is on the PWM terminal, the logic low voltage is less than the voltage on the node V2. As a result, the diode in the pass device 204 is reverse biased. The reverse biased diode prevents the voltage on the node V2 from having an impact on the logic low voltage.

In normal operation, the clamping switch Q2 is turned off by a low gate voltage generated by the fault logic unit 202. Since the clamping switch Q2 is turned off, the clamping switch Q2 and the pass device 204 form a high impedance circuit coupled to the PWM terminal. When a fault occurs, the fault logic unit 202 generates a gate drive signal to turn on the clamping switch Q2. The clamping circuit 206 provides a predetermined voltage at the node V1. In addition, the clamping circuit 206 provides a sink current to clamp the logic high voltage of the PWM signal to a lower voltage (e.g., 3 V). During the clamping process, the pass device 204 functions as a buffer. This buffer is able to provide isolation so as to prevent the clamping switch Q2 from seeing the harsh environment on the input/output terminal. Furthermore, when the PWM signal is of a logic low state, the clamping switch Q2 and/or the pass device 204 can block the clamping action from having an impact on the PWM signal. As a result, the logic low state of the PWM signal can be reliably detected by the PWM controller 100. In other words, the PWM signal can be correctly received by the PWM controller 100 even when the fault clamping is triggered.

In operation, the operating conditions vary depending on different applications. The different operating conditions may cause a significant voltage drop difference across the pass device 204. Such a significant voltage drop difference makes it difficult for the system controller 150 to determine whether a fault occurs. In some embodiments, three different fault diagnosis methods are employed to help the system controller 150 to correctly determine whether a fault occurs.

In a first method, the logic high voltage of the PWM signal is sensed after the fault event occurs. The sensed logic high voltage of the PWM signal is compared with a predetermined level (e.g., 3 V). The predetermined reference VREF is adjusted based on the comparison result. For example, if the sensed logic high voltage of the PWM signal is less than the predetermined level, the predetermined reference VREF is increased until the sensed logic high voltage of the PWM signal is equal to the predetermined level. On the other hand, if the sensed logic high voltage of the PWM signal is higher than the predetermined level, the predetermined reference VREF is reduced until the sensed logic high voltage of the PWM signal is equal to the predetermined level. By employing the first method, the logic high voltage of the PWM signal is equal to the predetermined level under various operating conditions. The control circuit for adjusting the predetermined reference VREF will be described below with respect to FIG. 10.

In a second method, the logic high voltage of the PWM signal is sensed after the fault event occurs. The sensed logic high voltage of the PWM signal is compared with a predetermined level (e.g., 3 V). The gate drive voltage of the clamping switch Q2 is adjusted based on the comparison result. For example, if the sensed logic high voltage of the PWM signal is less than the predetermined level, the gate drive voltage of the clamping switch Q2 is reduced. The reduced gate drive voltage results in a significant voltage drop across the clamping switch Q2. This significant voltage drop across the clamping switch Q2 helps the sensed logic high voltage of the PWM signal to be equal to the predetermined level. By employing the second method, the logic high voltage of the PWM signal is equal to the predetermined level under various operating conditions. The control circuit for adjusting the gate drive voltage will be described below with respect to FIG. 11.

In a third method, the logic high voltage of the PWM signal is sensed after the fault event occurs. The sensed logic high voltage of the PWM signal is compared with a predetermined level (e.g., 3 V). When the logic high voltage of the PWM signal is less than the predetermined level, the gate drive voltage of the clamping switch Q2 is reduced so that the logic high voltage of the PWM signal is equal to the predetermined level. On the other hand, when the logic high voltage of the PWM signal is greater than the predetermined level, the predetermined reference VREF is reduced so that the logic high voltage of the PWM signal is equal to the predetermined level. By employing the third method, the logic high voltage of the PWM signal is equal to the predetermined level under various operating conditions. The control circuit for adjusting both the predetermined reference VREF and the gate drive voltage will be described below with respect to FIG. 12.

In some embodiments, depending on different applications and design needs, the clamping switch Q2 may be replaced by an isolation switch. This isolation switch is formed by two back-to-back connected transistors, namely a first transistor and a second transistor. In some embodiments, when the logic high voltage of the PWM signal is less than the predetermined level, the gate drive voltage of the first transistor of the isolation switch is reduced so that the logic high voltage of the PWM signal is equal to the predetermined level. In alternative embodiments, when the logic high voltage of the PWM signal is less than the predetermined level, the gate drive voltage of the second transistor of the isolation switch is reduced so that the logic high voltage of the PWM signal is equal to the predetermined level. Furthermore, when the logic high voltage of the PWM signal is less than the predetermined level, the gate drive voltage of the first transistor and the gate drive voltage of the second transistor are adjusted in an alternating manner so that the logic high voltage of the PWM signal is equal to the predetermined level.

One advantageous feature of adjusting the gate drive voltages of the first transistor and the second transistor in an alternating manner is the power dissipation can be evenly distributed in these two transistors.

Figure 3:
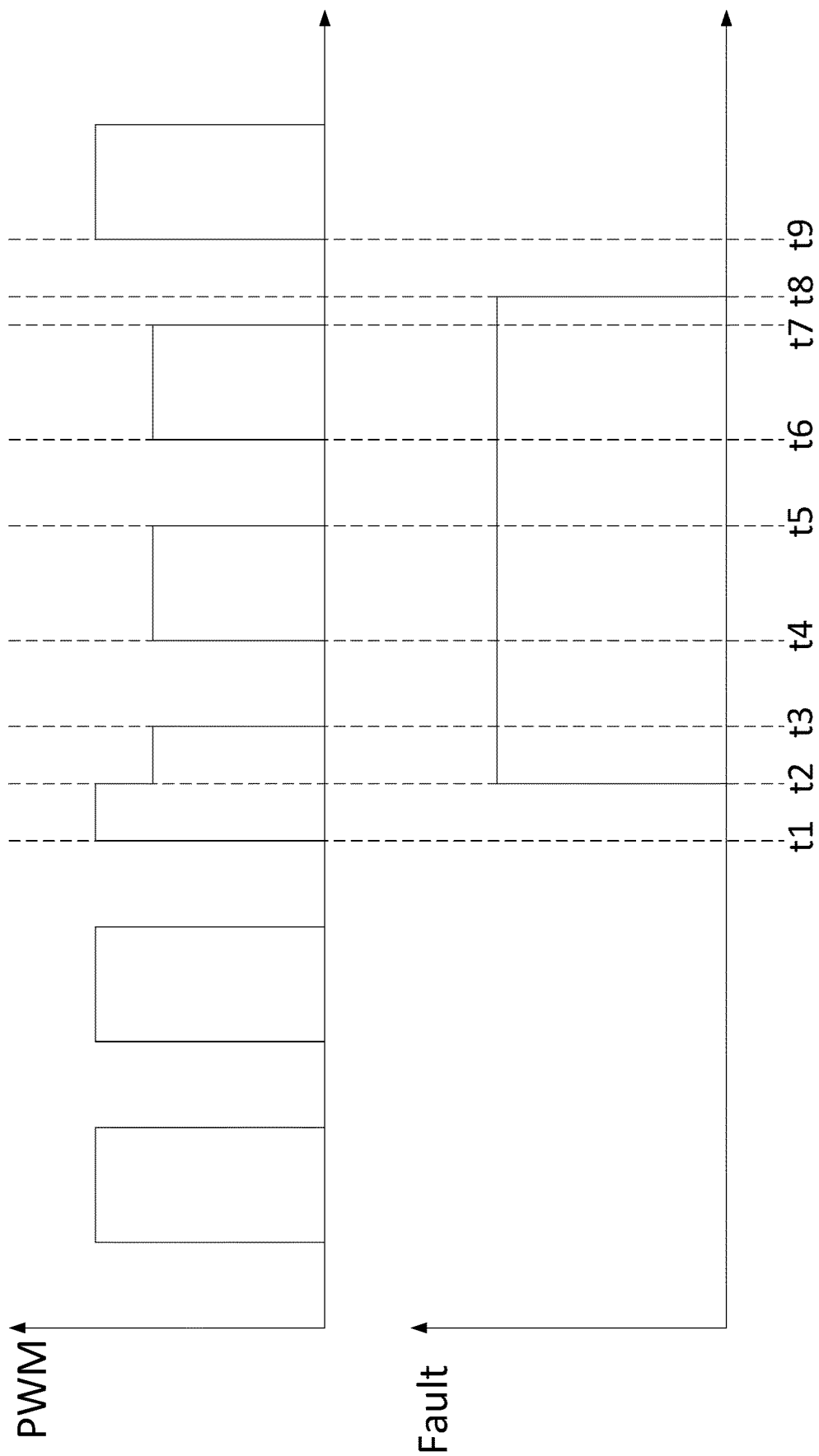
FIG. 3 illustrates two signals associated with the fault diagnosis apparatus shown in FIG. 2 when the fault diagnosis apparatus is configured to operate under a first control mechanism in accordance with various embodiments of the present disclosure.

FIG. 3 illustrates two signals associated with the fault diagnosis apparatus shown in FIG. 2 when the fault diagnosis apparatus is configured to operate under a first control mechanism in accordance with various embodiments of the present disclosure. The horizontal axis represents intervals of time. There are two rows. The first row represents the PWM signal. The second row represents a fault signal generated once a fault occurs.

Under the first control mechanism, the fault diagnosis apparatus is enabled once the fault is detected. As shown in FIG. 3, at t1, the PWM signal changes from a logic low state to a logic high state (e.g., 4 V). At t2, a fault occurs. In response to this fault, the fault signal is generated by a suitable fault detection device. At t2, the fault logic unit enables the operation amplifier A1 and turns on the clamping switch Q2. As described above with respect to FIG. 2, the clamping circuit 206, the clamping switch Q2 and the pass device 204 are configured such that the logic high voltage on the PWM terminal is clamped to a predetermined set point (e.g., 3 V). As shown in FIG. 3, the PWM pulse in the time duration from t1 to t3 has two logic high levels (e.g., 4 V and 3 V).

At t3, the PWM signal changes from the logic high state to the logic low state. At t4, the PWM signal changes from the logic low state to the logic high state. From t4 to t5, the logic high voltage stays at the predetermined set point (e.g., 3 V). From t6 to t7, the logic high voltage stays at the predetermined set point (e.g., 3 V). At t8, the fault disappears. The fault signal changes from the logic high state to the logic low state as shown in FIG. 3. At t9, the PWM signal goes back to normal.

Figure 4:
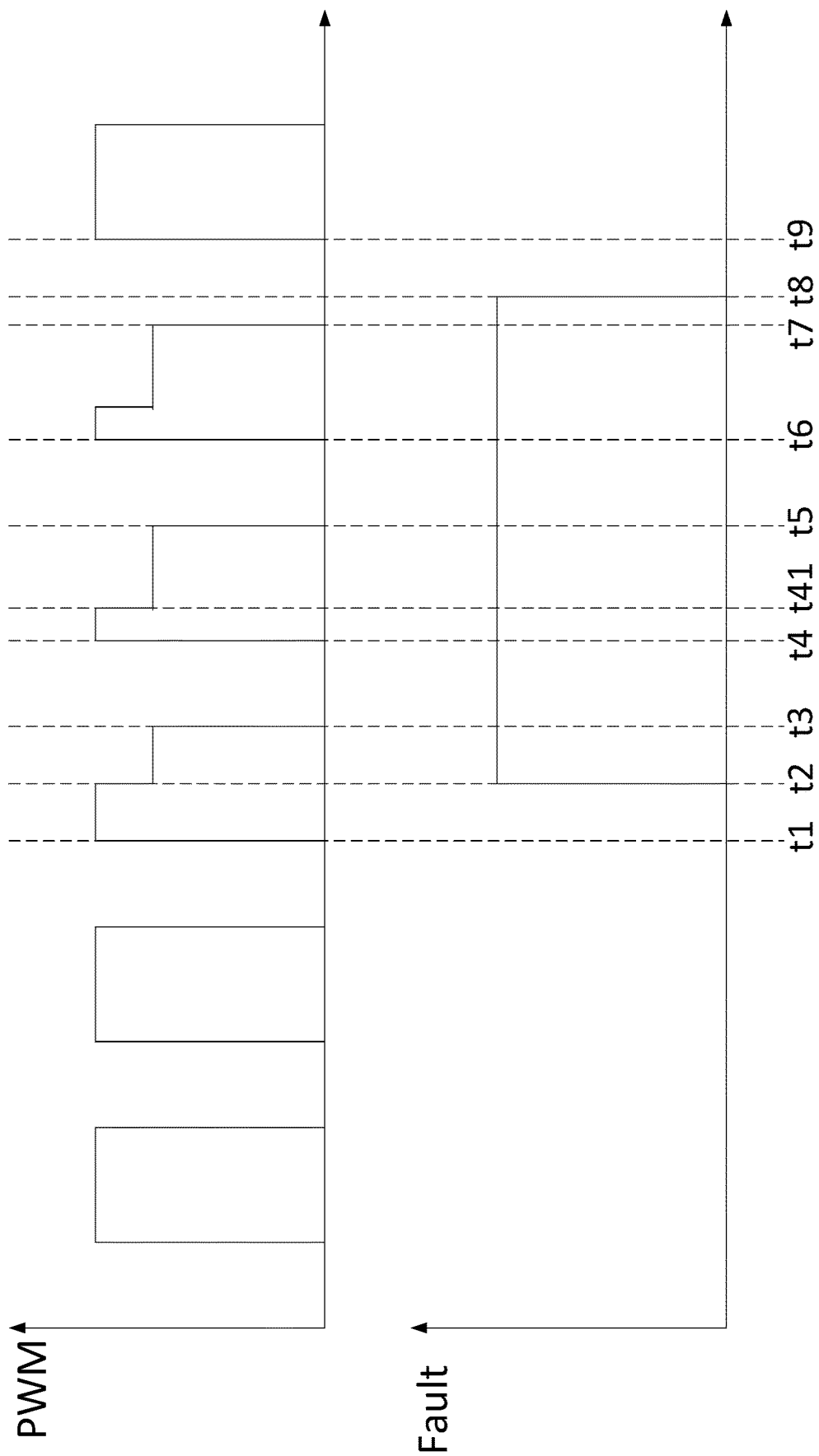
FIG. 4 illustrates two signals associated with the fault diagnosis apparatus shown in FIG. 2 when the fault diagnosis apparatus is configured to operate under a second control mechanism in accordance with various embodiments of the present disclosure.

FIG. 4 illustrates two signals associated with the fault diagnosis apparatus shown in FIG. 2 when the fault diagnosis apparatus is configured to operate under a second control mechanism in accordance with various embodiments of the present disclosure. Under the second control mechanism, the operating principle of the fault diagnosis apparatus is similar to that shown in FIG. 3 except that there is a predetermined delay (from t4 to t41 as shown in FIG. 4).

From t2 to t8, in each PWM pulse, due to the predetermined delay, the PWM pulse stays at the normal logic high voltage (e.g., 4 V) at the beginning portion of the PWM pulse. After the predetermined delay, the clamping circuit 206, the clamping switch Q2 and the pass device 204 are configured such that the logic high voltage on the PWM terminal is clamped to a predetermined set point (e.g., 3 V). As shown in FIG. 4, the PWM pulses in the time duration from t1 to t9 have two different logic high levels (e.g., 4 V and 3 V).

Figure 5:
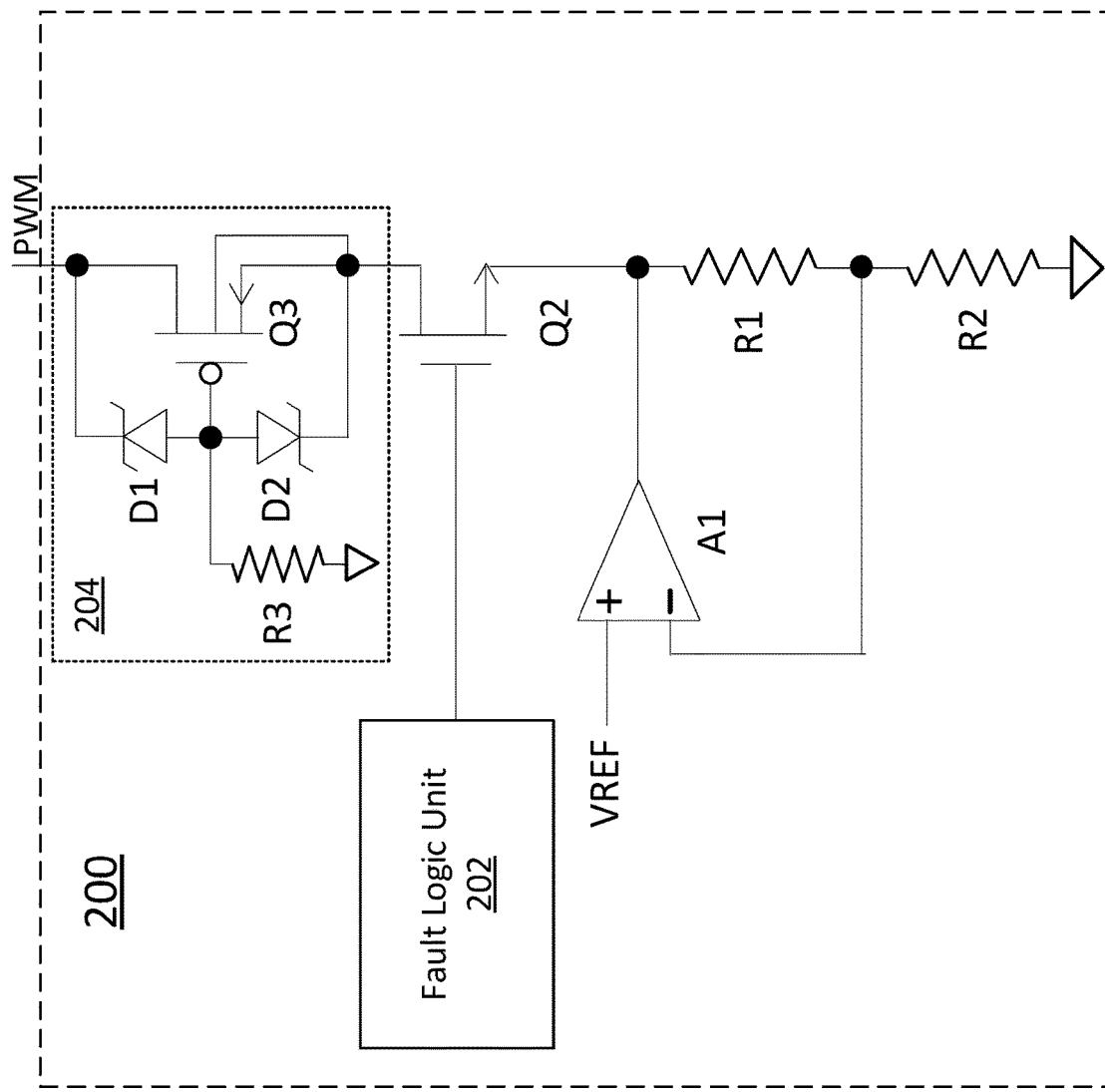
FIG. 5 illustrates a first implementation of the pass device shown in FIG. 2 in accordance with various embodiments of the present disclosure.

FIG. 5 illustrates a first implementation of the pass device shown in FIG. 2 in accordance with various embodiments of the present disclosure. The pass device 204 comprises a p-type transistor Q3, a first clamping diode D1, a second clamping diode D2 and a bias resistor R3.

As shown in FIG. 5, a body terminal and a source terminal of the p-type transistor Q3 are connected to each other. The first clamping diode D1 is connected between a gate terminal and a drain terminal of the p-type transistor Q3. The second clamping diode D2 is connected between the gate terminal and the source terminal of the p-type transistor Q3. The bias resistor R3 is connected between the gate terminal of the p-type transistor Q3 and ground.

In operation, when a logic high voltage is on the PWM terminal, the channel of the p-type transistor Q3 is turned on because the gate terminal of Q3 is connected to ground through the bias resistor R3. When a logic low voltage is on the PWM terminal, the channel of the p-type transistor Q3 is turned off. The first clamping diode D1 and the second clamping diode D2 function as protection devices to prevent the p-type transistor Q3 from being damaged.

One advantageous feature of having the p-type transistor Q3 is that the p-type transistor Q3 is able to protect the clamp switch Q2 from harsh operating conditions at the input/output line (e.g., ESD, Latch up and the like) because the p-type transistor (e.g., Q3) is more robust than the n-type transistor (e.g., Q2).

Another advantageous feature of having the p-type transistor Q3 is that when the p-type transistor Q3 is turned on, Q3 provides a zero voltage drop, thereby achieving accurate clamping.

Figure 6:
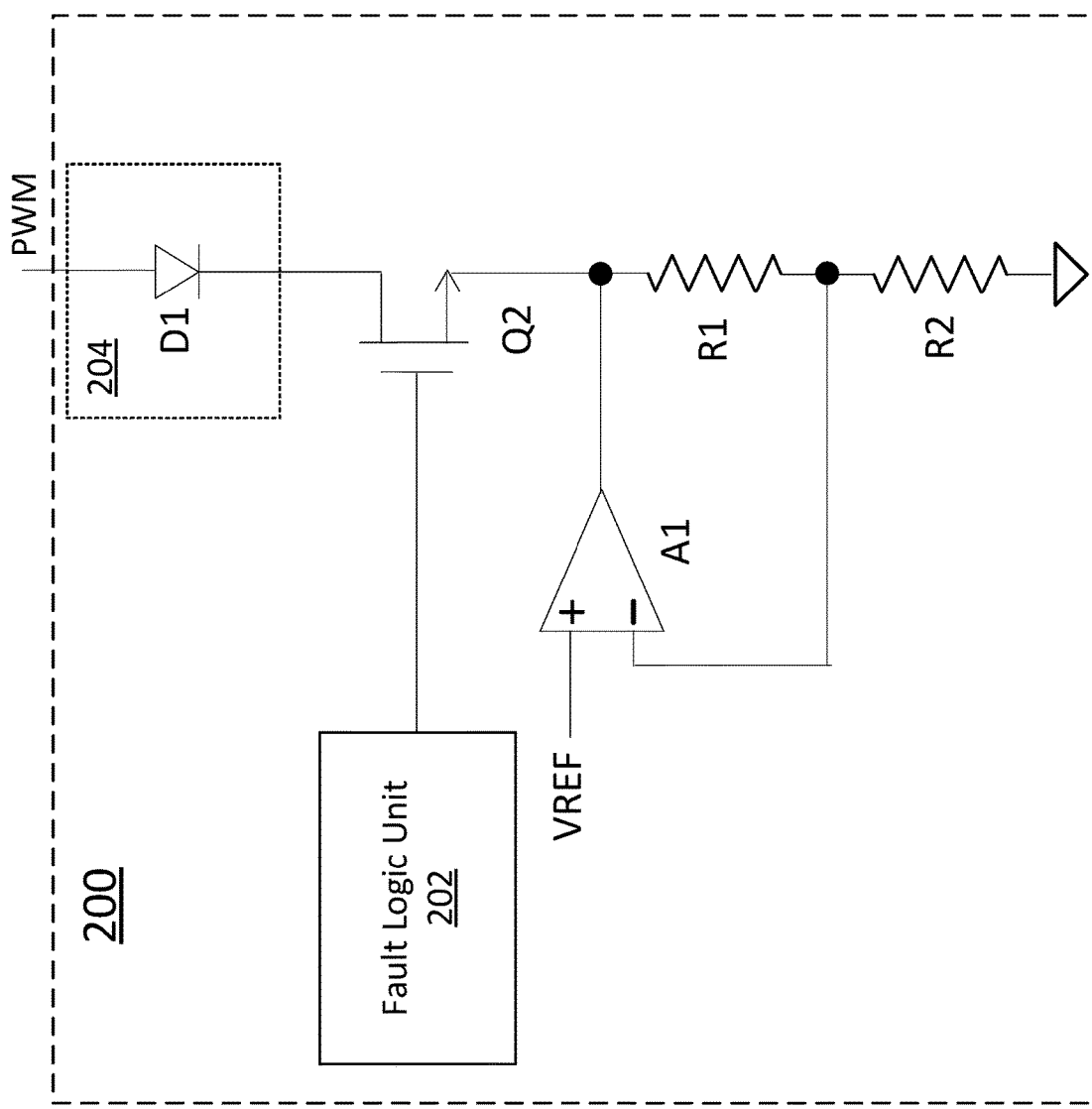
FIG. 6 illustrates a second implementation of the pass device shown in FIG. 2 in accordance with various embodiments of the present disclosure.

FIG. 6 illustrates a second implementation of the pass device shown in FIG. 2 in accordance with various embodiments of the present disclosure. The pass device 204 comprises a diode D1. As shown in FIG. 6, an anode of the diode D1 is connected to the input/output terminal (e.g., PWM terminal) of the PWM controller 100. A cathode of the diode D1 is connected to the clamping switch Q2.

In operation, when a logic high voltage is on the PWM terminal, the forward biased D1 provides a conductive path to pull down the logic high voltage from a first voltage level (e.g., 4 V) to a second voltage level (e.g., 3 V). When a logic low voltage is on the PWM terminal, the reverse biased D1 prevents the clamping circuit from having an impact on the logic low voltage. Furthermore, the diode D1 provides isolation, thereby protecting the clamping switch Q2 from being damaged when there is a large negative voltage on the input/output line (e.g., the line between the microcontroller and the PWM terminal of the PWM controller).

Figure 7:
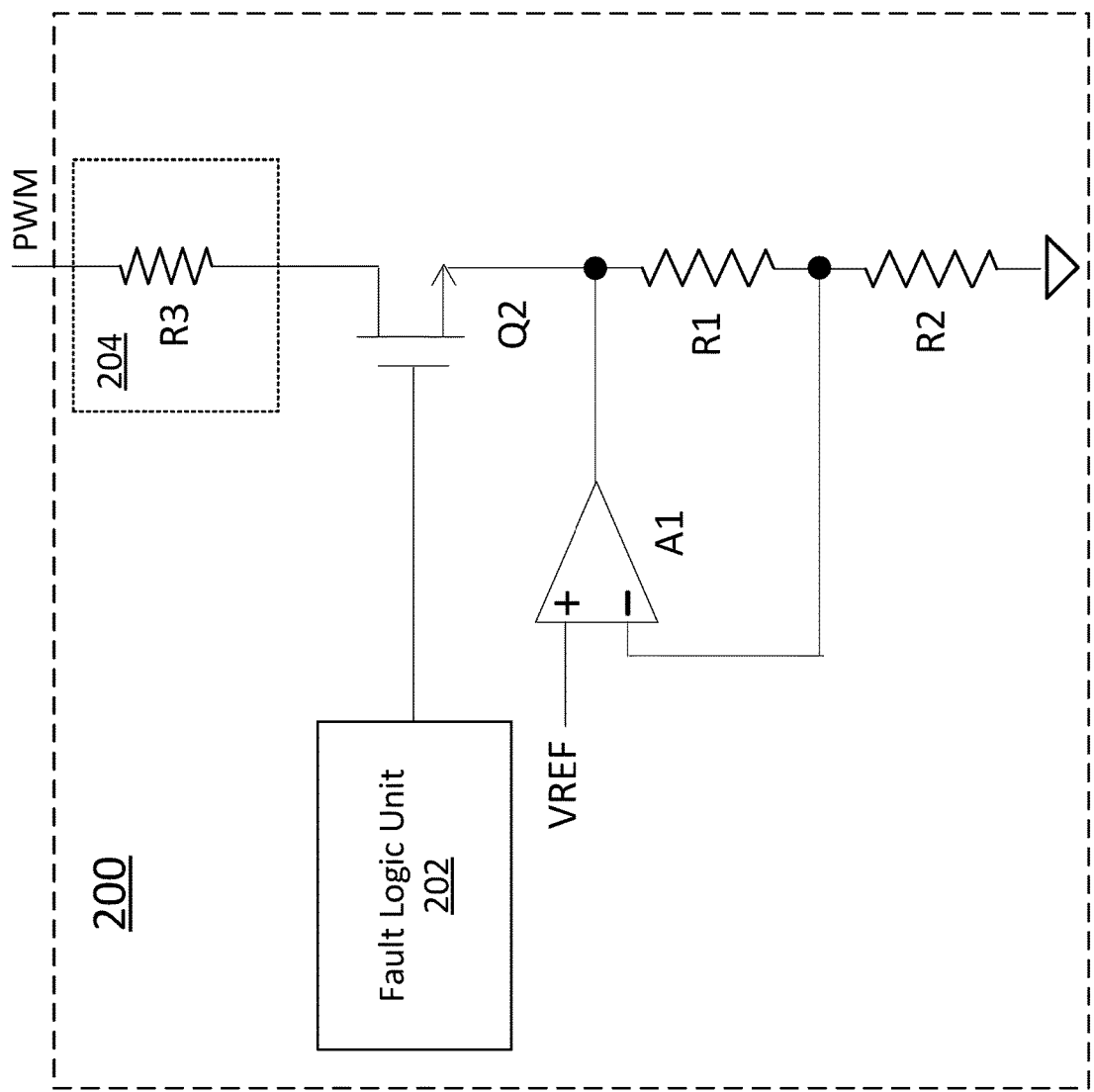
FIG. 7 illustrates a third implementation of the pass device shown in FIG. 2 in accordance with various embodiments of the present disclosure.

FIG. 7 illustrates a third implementation of the pass device shown in FIG. 2 in accordance with various embodiments of the present disclosure. The pass device 204 comprises a resistor R3 connected between the input/output terminal (e.g., PWM terminal) of the PWM controller 100 and the clamping switch Q2.

In operation, since the pass device is implemented as a resistor, the voltage clamping is active in the whole PWM cycle. A low resistance value of R3 may provide a strong clamping action. However, such a low resistance value may result in a false logic high voltage detection when the system controller 150 sends a logic low voltage to the PWM controller 100. The resistance value of R3 may be selected based on various factors including the value of the logic high voltage, the value of the logic low voltage, the sink current capability under a logic high voltage and the source current capability under a logic low voltage. In some embodiments, R3 may be implemented as an adjustable resistor. When a logic low voltage is on the PWM terminal, R3 is of a high resistance value. When a logic high voltage is on the PWM terminal, R3 is of a low resistance value.

Figure 8:
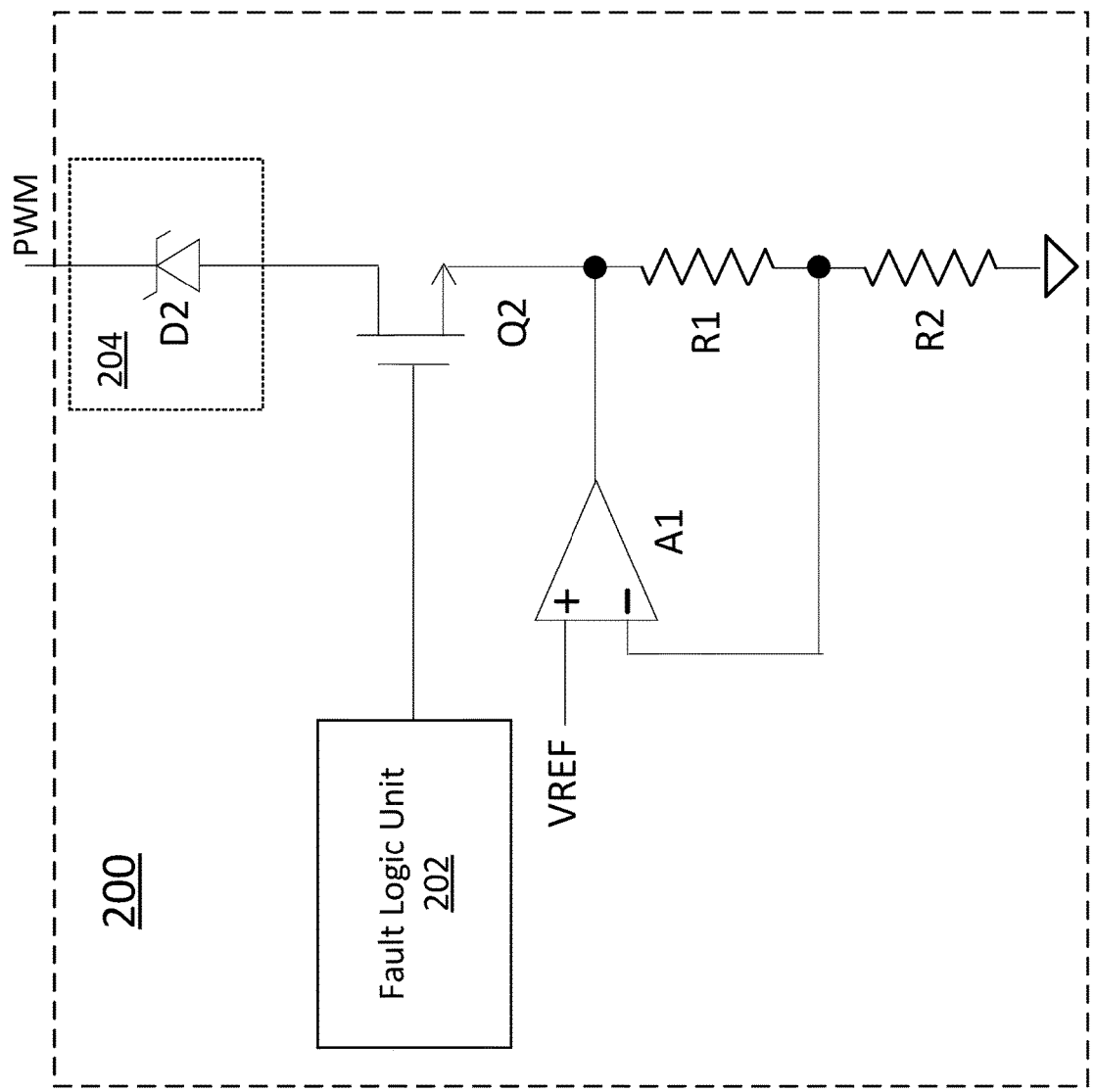
FIG. 8 illustrates a fourth implementation of the pass device shown in FIG. 2 in accordance with various embodiments of the present disclosure.

FIG. 8 illustrates a fourth implementation of the pass device shown in FIG. 2 in accordance with various embodiments of the present disclosure. The pass device 204 comprises an ESD device. The ESD device includes, but not limited to, the common ESD circuits such as diodes, NMOS transistors, PMOS transistors, bipolar junction transistors, any combinations thereof and the like.

In some embodiments, the ESD device in the pass device 204 is implemented as a Zener diode D2 as shown in FIG. 8. A cathode of the Zener diode D2 is connected to the input/output terminal of the PWM controller 100. An anode of the Zener diode is connected to the clamping switch Q2.

Figure 9:
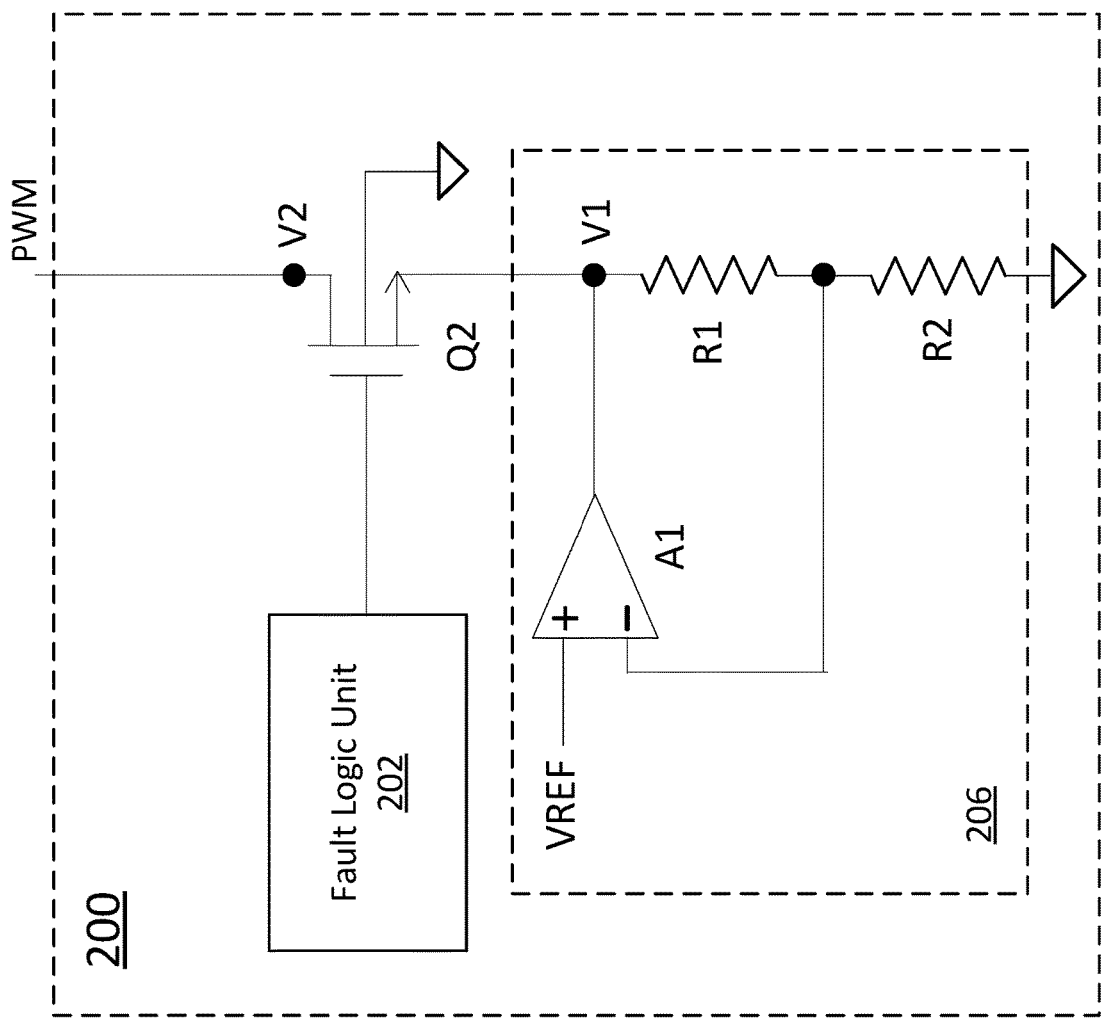
FIG. 9 illustrates a schematic diagram of a second implementation of the fault diagnosis apparatus shown in FIG. 1 in accordance with various embodiments of the present disclosure.

FIG. 9 illustrates a schematic diagram of a second implementation of the fault diagnosis apparatus shown in FIG. 1 in accordance with various embodiments of the present disclosure. The a second implementation of the fault diagnosis apparatus shown in FIG. 9 is similar to the first implementation of the fault diagnosis apparatus shown in FIG. 2 except that the clamping switch is merged into an NMOS ESD cell. The pass device can be replaced by the NMOS ESD cell. Therefore, the pass device can be omitted as shown in FIG. 9.

Figure 10:
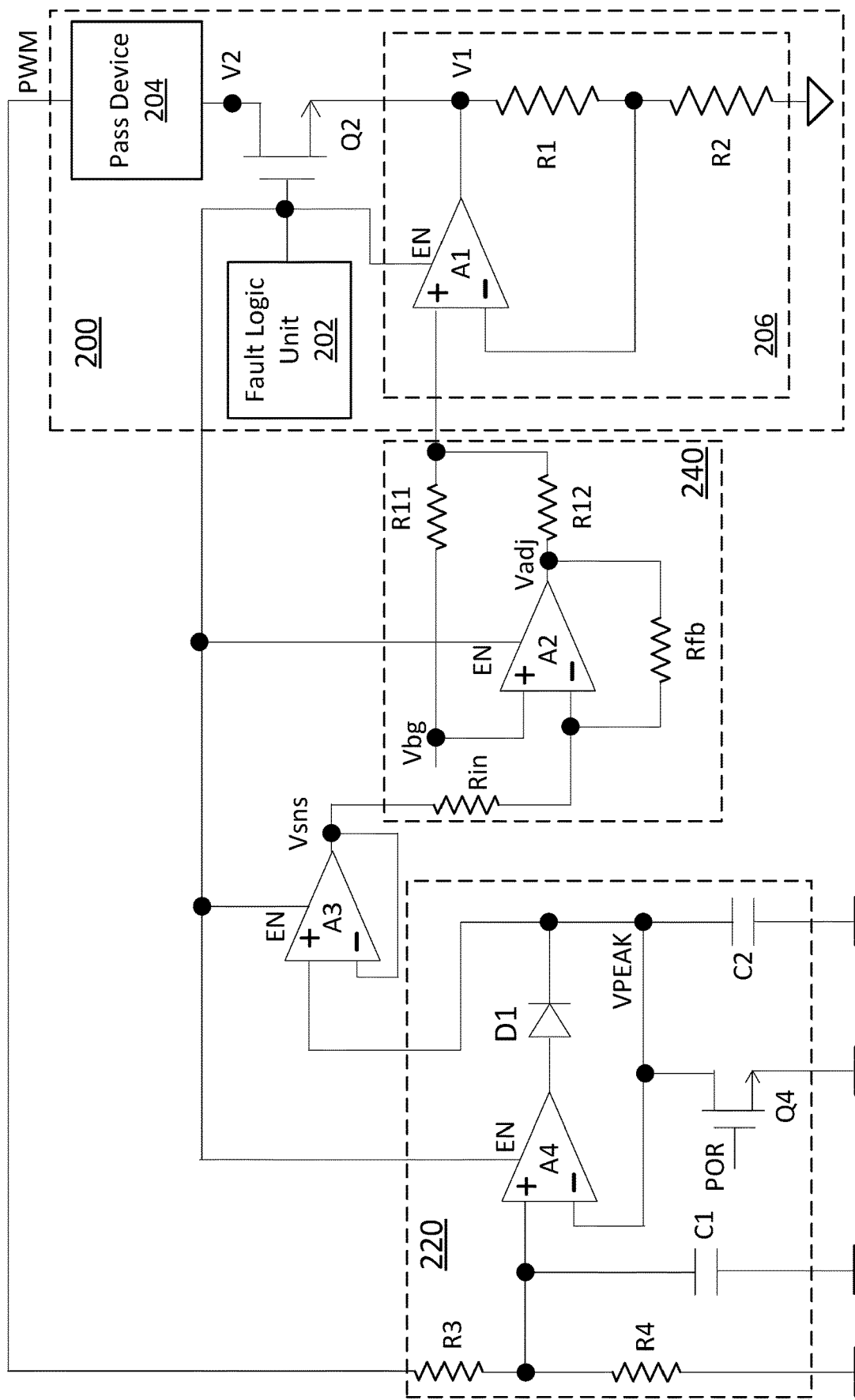
FIG. 10 illustrates a schematic diagram of a control circuit for adjusting the reference voltage in accordance with various embodiments of the present disclosure.

FIG. 10 illustrates a schematic diagram of a control circuit for adjusting the reference voltage in accordance with various embodiments of the present disclosure. The control circuit for adjusting the reference voltage includes a peak voltage detector 220, a buffer formed by an amplifier A3 and an adder 240. The peak voltage detector 220 is configured to detect the variations of the voltage on the PWM terminal. As shown in FIG. 10, the peak voltage detector 220 comprises a voltage divider formed by resistors R3 and R4, an amplifier A4, a diode D1, a first capacitor C1, a power-up reset switch Q4 and a second capacitor C2.

The voltage on the PWM terminal is fed into the non-inverting input of the amplifier A4 through the voltage divider. The first capacitor C1 and the voltage divider form a low-pass filter to attenuate unwanted signals. The power-up reset switch Q4 is controlled by a power-up reset signal POR. The power-up reset signal POR is configured such that the peak voltage detector can be reset and detect new peaks. As shown in FIG. 10, the peak voltage detector is configured to provide a signal VPEAK representing a sampled version of the voltage on the PWM terminal.

The sampled signal VPEAK is buffered at the amplifier A3 to generate a signal Vsns representing a sampled version of the voltage on the PWM terminal. A bandgap reference circuit (not shown) is configured to generate a reference voltage Vbg.

The adder 240 comprises a differential amplifier A2 and two summing resistors R11 and R12. According to the operating principle of the differential amplifier, the output voltage Vadj of the differential amplifier A2 can be expressed by the following equation:

$$Vadj = Vbg + \frac{Rfb}{Rin} \times (Vbg - Vsns) \qquad (2)$$

Through the two summing resistors R11 and R12, the difference of Vbg and Vsns is fed into the non-inverting input of the amplifier A1. The difference of Vbg and Vsns functions as an input of a negative feedback loop. Through this negative feedback loop, the voltage on the PWM terminal is precisely regulated at a predetermined value (e.g., 3 V). In some embodiments, in FIG. 10, Rin is equal to 10 KΩ. Rfb is equal to 200 KΩ. Vbg is equal to 1.2 V. Vsns is equal to 1.26 V. R11 is equal to 10 KΩ. R12 is equal to 5 KΩ. R1 is equal to 100Ω. R2 is equal to 83.3Ω. The voltage on the PWM terminal is regulated at 3.01 V, which is close to the predetermined value 3.0 V. In contrast, without the control circuit for adjusting the reference voltage shown in FIG. 10, the voltage on the PWM terminal is regulated at 3.15 V. The control circuit for adjusting the reference voltage shown in FIG. 10 can improve the voltage regulation accuracy.

Figure 11:
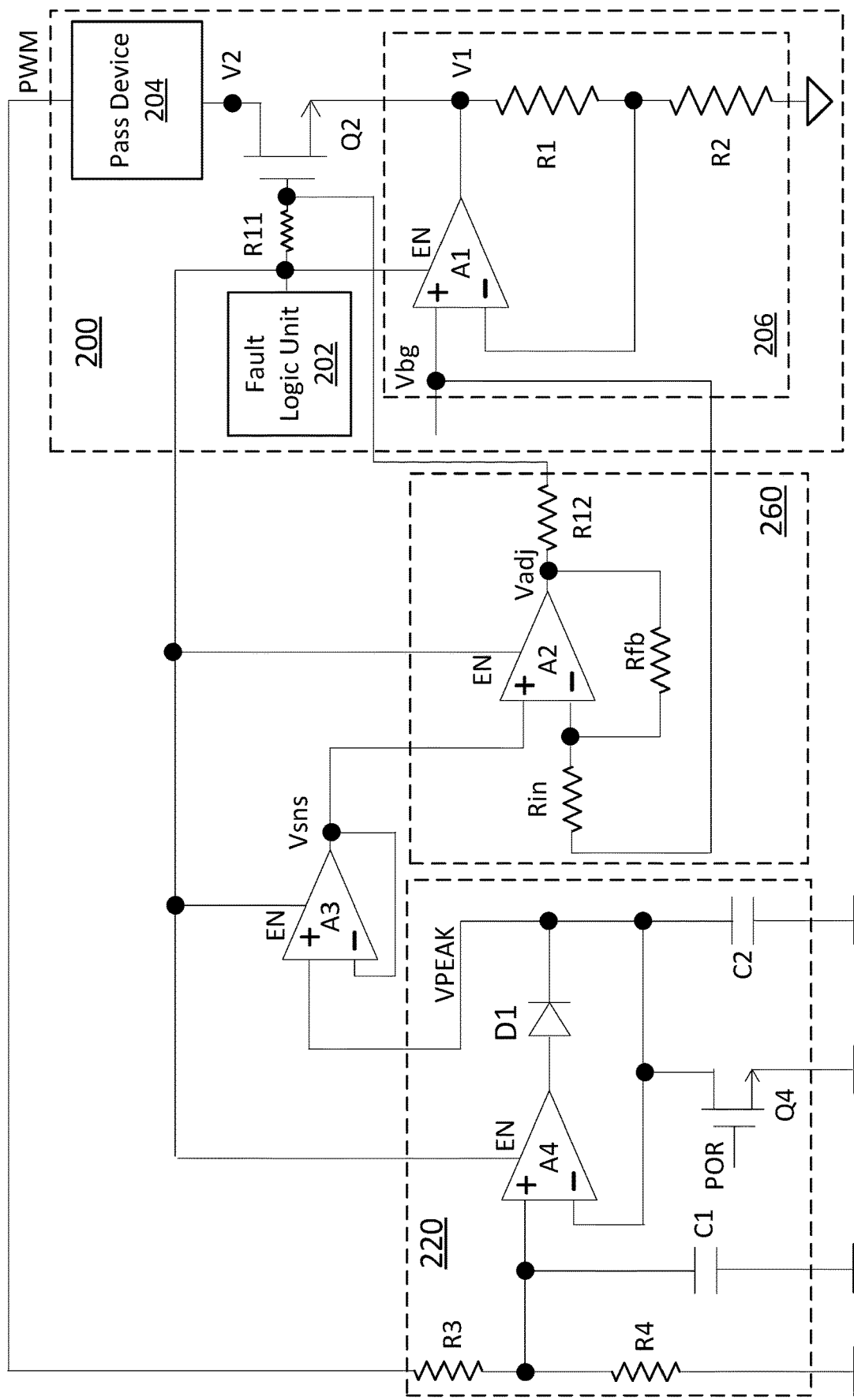
FIG. 11 illustrates a schematic diagram of a control circuit for adjusting the gate drive voltage in accordance with various embodiments of the present disclosure.

FIG. 11 illustrates a schematic diagram of a control circuit for adjusting the gate drive voltage in accordance with various embodiments of the present disclosure. The control circuit shown in FIG. 11 is similar to the control circuit shown in FIG. 10 except that the sampled signal (i.e. Vsns) is fed into the non-inverting input of the amplifier A2 and the output voltage (i.e. Vadj) of the amplifier A2 is added into the gate drive voltage of Q2. The output voltage of the amplifier A2 can be expressed by the following equation:

$$Vadj = Vsns + \frac{Rfb}{Rin} \times (Vsns - Vbg) \qquad (3)$$

Through the circuit shown in FIG. 11, if the logic high voltage on the PWM terminal is less than a predetermined level (e.g., 3 V), the output voltage Vadj of the amplifier A2 is reduced according to Equation (3). The reduced Vadj is added into the gate drive voltage of the clamping switch Q2. As a result, the gate drive voltage of the clamping switch Q2 is reduced. The reduced gate drive voltage results in a significant voltage drop across the clamping switch Q2. This significant voltage drop across the clamping switch Q2 helps the logic high voltage on the PWM terminal increase until the logic high voltage on the PWM terminal reaches the predetermined level (e.g., 3 V). On the other hand, if the logic high voltage on the PWM terminal is greater than the predetermined level (e.g., 3 V), the circuit shown in FIG. 11 can similarly help the logic high voltage on the PWM terminal reach the predetermined level (e.g., 3 V). In some embodiments, in FIG. 11, Rin is equal to 10 KΩ. Rfb is equal to 200 KΩ. Vbg is equal to 1.2 V. Vsns is equal to 1.239 V. R11 is equal to 10 KΩ. R12 is equal to 5 KΩ. R1 is equal to 100Ω. R2 is equal to 110Ω. V1 is equal to 2.29 V. V2 is equal to 2.485 V. The voltage on the PWM terminal is regulated at 3.01 V, which is close to the predetermined value 3.0 V. In contrast, without the control circuit for adjusting the gate drive voltage shown in FIG. 11, the voltage on the PWM terminal is regulated at 2.828 V. The control circuit for adjusting the gate drive voltage shown in FIG. 11 can improve the voltage regulation accuracy.

Figure 12:
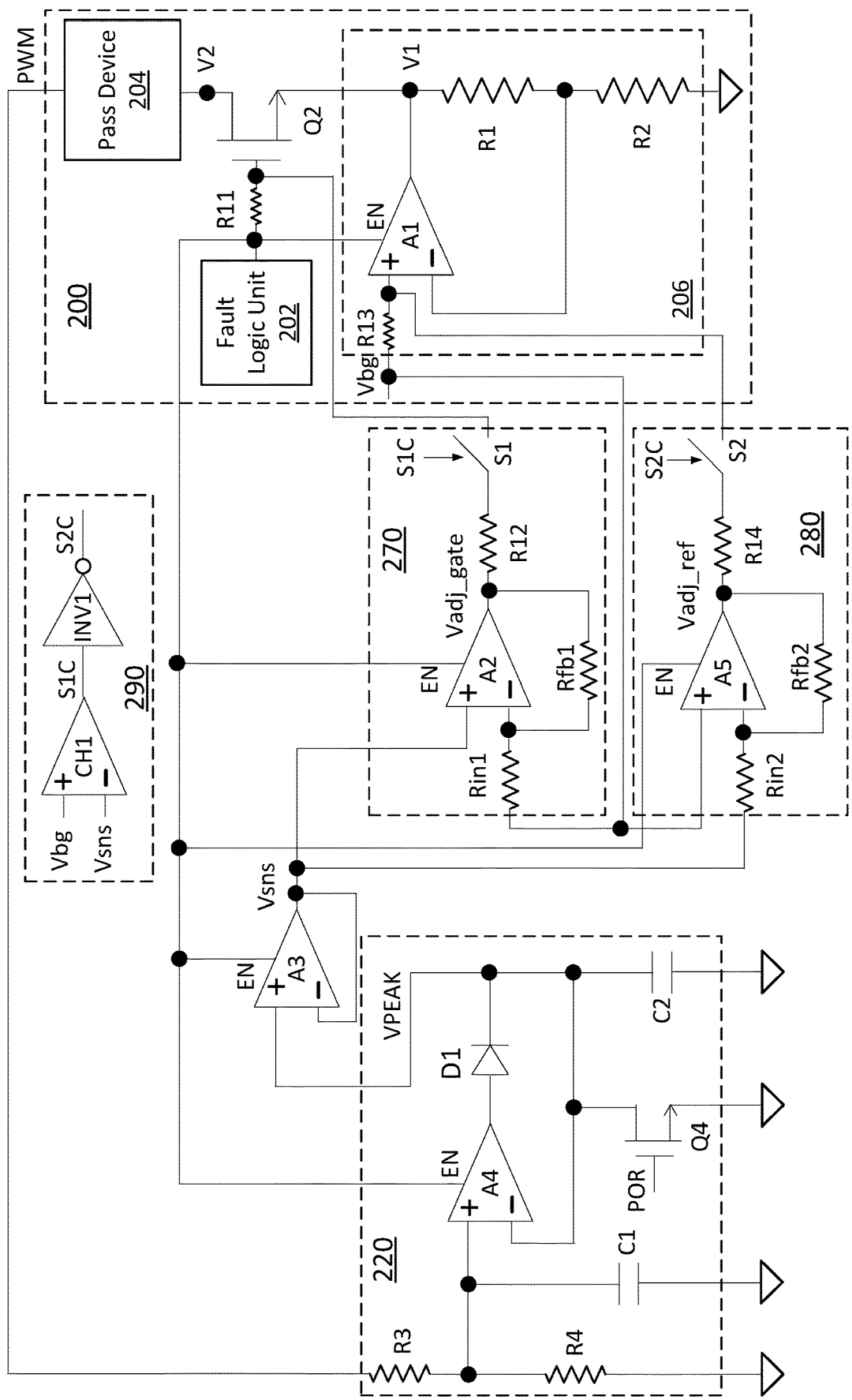
FIG. 12 illustrates a schematic diagram of a control circuit for adjusting both the reference voltage and the gate drive voltage in accordance with various embodiments of the present disclosure.

FIG. 12 illustrates a schematic diagram of a control circuit for adjusting both the reference voltage and the gate drive voltage in accordance with various embodiments of the present disclosure. The control circuit shown in FIG. 12 is a combination of the control circuit shown in FIG. 10 and the control circuit shown in FIG. 11. A first circuit block 270 comprises an amplifier A2, resistors Rin1, Rfb1, R12, and a first switch S1. The first circuit block 270 is employed to generate a signal to adjust the gate drive voltage of the clamping switch Q2. The output voltage of the amplifier A2 can be expressed by the following equation:

$$\text{Vadj\_gate} = Vsns + \frac{Rfb1}{Rin1} \times (Vsns - Vbg) \quad (4)$$

As shown in FIG. 12, the output voltage Vadj_gate of the amplifier A2 is added into the gate drive voltage of the clamping switch Q2 through the resistor R12 and the first switch S1. The operating principle of the amplifier A2 has been described above with respect to FIG. 11, and hence is not discussed again herein.

A second circuit block 280 comprises an amplifier A5, resistors Rin2, Rfb2, R14, and a second switch S2. The second circuit block 280 is employed to generate a signal to adjust the reference voltage fed into the non-inverting input of the amplifier A1. The output voltage of the amplifier A5 can be expressed by the following equation:

$$Vadj = Vbg + \frac{Rfb2}{Rin2} \times (Vbg - Vsns) \quad (5)$$

As shown in FIG. 12, the output voltage Vadj_ref of the amplifier A5 is added into the non-inverting input of the amplifier A1 through the resistor R14 and the second switch S2. The operating principle of the amplifier A5 has been described above with respect to FIG. 10, and hence is not discussed again herein.

A third circuit block 290 is employed to control the on and off of the switches S1 and S2. As shown in FIG. 12, Vbg is fed into a non-inverting input of a comparator CH1. Vsns is fed into an inverting input of the comparator CH1. The output of the comparator CH1 is connected to an input of an inverter INV1. The output signal S1C of the comparator CH1 is used to control the first switch S1. The output signal S2C of the inverter INV1 is used to control the second switch S2. The comparator CH1 and the inverter INV1 are configured such that the following control goals can be achieved. First, when the logic high voltage on the PWM terminal is less than the predetermined level (e.g., 3 V), the first switch S1 is turned on and the second switch S2 is turned off. The gate drive voltage of the clamping switch Q2 is reduced by the first circuit block 270. In operation, the first circuit block 270 keeps reducing the gate drive voltage of Q2 until the logic high voltage on the PWM terminal is equal to the predetermined level (e.g., 3 V). Second, when the logic high voltage on the PWM terminal is greater than the predetermined level (e.g., 3 V), the first switch S1 is turned off and the second switch S2 is turned on. The reference fed into the non-inverting input of the amplifier A1 is reduced by the second circuit block 280. In operation, the second circuit block 280 keeps reducing the reference fed into the non-inverting input of the amplifier A1 until the logic high voltage on the PWM terminal is equal to the predetermined level (e.g., 3 V). If the two input signals of the comparator CH1 are swapped (i.e., Vbg is coupled to the inverting input terminal, and Vsns is coupled to the non-inverting input terminal), the circuit shown in FIG. 12 can similarly help the logic high voltage on the PWM terminal reach the predetermined level (e.g., 3 V).

Figure 13:
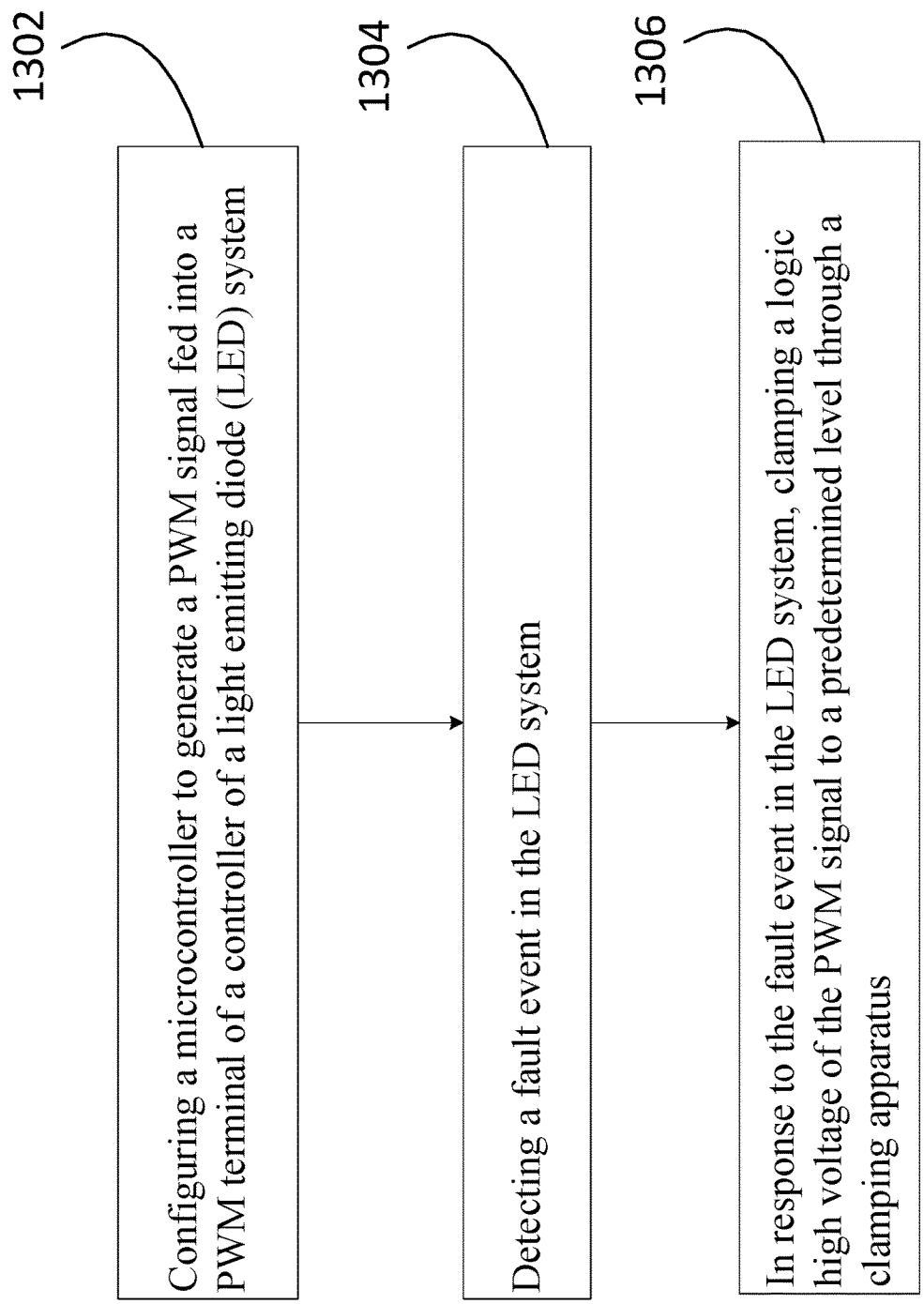
FIG. 13 illustrates a flow chart of controlling the light emitting diode system shown in FIG. 1 in accordance with various embodiments of the present disclosure.

FIG. 13 illustrates a flow chart of controlling the light emitting diode system shown in FIG. 1 in accordance with various embodiments of the present disclosure. This flowchart shown in FIG. 13 is merely an example, which should not unduly limit the scope of the claims. One of ordinary skill in the art would recognize many variations, alternatives, and modifications. For example, various steps illustrated in FIG. 13 may be added, removed, replaced, rearranged and repeated.

Referring back to FIGS. 1 and 2, a plurality of light emitting diodes (e.g., D1-DN shown in FIG. 1) is connected in series between an input voltage bus (e.g., VIN shown in FIG. 1) and a power switch (e.g., Q1 shown in FIG. 1). A PWM controller (e.g., PWM controller 100 shown in FIG. 1) is configured to generate a gate drive signal fed into a gate of the power switch. A fault diagnosis apparatus (e.g., fault diagnosis apparatus 200 shown in FIG. 1) is coupled to a PWM terminal of the PWM controller. The fault diagnosis circuit comprises a clamping circuit (e.g., clamping circuit 206 shown in FIG. 2) configured to provide a predetermined voltage at an output of the clamping circuit, a clamping switch (e.g., clamping switch Q2 shown in FIG. 2) coupled to the output of the clamping circuit, and a pass device (e.g., pass device 204 shown in FIG. 2) connected between the clamping switch and an input/output terminal of the PWM controller.

The clamping circuit comprises an operation amplifier (e.g., operation amplifier A1 shown in FIG. 2), a first resistor (e.g., R1 shown in FIG. 2) and a second resistor (e.g., R2 shown in FIG. 2. A non-inverting input of the operation amplifier is connected to a predetermined reference. An inverting input of the operation amplifier is connected to a common node of the first resistor and the second resistor. The first resistor and the second resistor are connected in series between an output of the operation amplifier and ground. The output of the operation amplifier is the output of the clamping circuit. The clamping switch has a gate connected to a fault logic unit (e.g., fault logic unit 202 shown in FIG. 2). The fault logic unit is configured such that in response to the fault event, the fault logic unit generates a signal to turn on the clamping switch.

A method below is employed to generate a fault diagnosis signal under a fault so that the system controller (e.g., a microcontroller) is able to determine whether the fault occurs in the light emitting diode system.

At step 1302, a microcontroller is configured to generate a PWM signal fed into a PWM terminal of a controller of a light emitting diode (LED) system.

At step 1304, a fault event is detected in the LED system.

At step 1306, in response to the fault event in the LED system, a logic high voltage of the PWM signal is clamped to a predetermined level through a clamping apparatus.

In some embodiments, the clamping apparatus comprises a clamping circuit configured to provide a predetermined voltage at an output of the clamping circuit, a clamping switch coupled to the output of the clamping circuit, and a pass device connected between the clamping switch and the PWM terminal of the controller.

In some embodiments, the clamping circuit comprises an operation amplifier, a first resistor and a second resistor. A non-inverting input of the operation amplifier is connected to a predetermined reference. An inverting input of the operation amplifier is connected to a common node of the first resistor and the second resistor. The first resistor and the second resistor are connected in series between an output of the operation amplifier and ground, and wherein the output of the operation amplifier is the output of the clamping circuit. The clamping switch has a gate connected to a fault logic unit, wherein the fault logic unit is configured such that in response to the fault event, the fault logic unit generates a signal to turn on the clamping switch. The pass device comprises a diode. An anode of the diode is connected to the input/output terminal of the integrated circuit. A cathode of the diode is connected to the clamping switch.

The method further comprises sensing the logic high voltage of the PWM signal after the fault event occurs, comparing the logic high voltage of the PWM signal with the predetermined level, and adjusting the predetermined reference based on a comparison result obtained in the step of comparing the logic high voltage of the PWM signal with the predetermined level, wherein as a result of adjusting the predetermined reference, the logic high voltage of the PWM signal is equal to the predetermined level under various operating conditions.

The method further comprises sensing the logic high voltage of the PWM signal after the fault event occurs, comparing the logic high voltage of the PWM signal with the predetermined level, and adjusting a gate drive voltage of the clamping switch based on a comparison result obtained in the step of comparing the logic high voltage of the PWM signal with the predetermined level, wherein as a result of adjusting the gate drive voltage of the clamping switch, the logic high voltage of the PWM signal is equal to the predetermined level under various operating conditions.

The method further comprises sensing the logic high voltage of the PWM signal after the fault event occurs, and comparing the logic high voltage of the PWM signal with the predetermined level. When the logic high voltage of the PWM signal is less than the predetermined level, reducing a gate drive voltage of the clamping switch so that the logic high voltage of the PWM signal is equal to the predetermined level. When the logic high voltage of the PWM signal is greater than the predetermined level, reducing the predetermined reference so that the logic high voltage of the PWM signal is equal to the predetermined level.

The method further comprises configuring the fault logic unit such that at least one PWM pulse of the PWM signal has two logic high levels.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a clamping circuit configured to provide a predetermined voltage at an output of the clamping circuit;
a clamping switch coupled to the output of the clamping circuit; and
a pass device connected between the clamping switch and an input/output terminal of a controller, wherein:
after the clamping switch is configured to be turned on, a current flows from the input/output terminal of the controller to the clamping circuit through the clamping switch.

2. The apparatus of claim 1, wherein:
the clamping circuit comprises an operation amplifier, a first resistor and a second resistor, and wherein:
a non-inverting input of the operation amplifier is connected to a predetermined reference;
an inverting input of the operation amplifier is connected to a common node of the first resistor and the second resistor; and
the first resistor and the second resistor are connected in series between an output of the operation amplifier and ground, and wherein the output of the operation amplifier is the output of the clamping circuit.

3. The apparatus of claim 1, wherein:
the clamping circuit, the clamping switch and the pass device are configured such that a logic high voltage on the input/output terminal of the controller is clamped to a predetermined set point in response to a fault event.

4. The apparatus of claim 1, further comprising:
a fault logic unit configured to detect a fault event, having an output connected to a gate of the clamping switch, wherein the fault logic unit is configured such that in response to a fault event, the fault logic unit generates a signal to turn on the clamping switch.

5. The apparatus of claim 1, wherein:
the pass device comprises a p-type transistor, a first clamping diode, a second clamping diode and a bias resistor, and wherein:
a body terminal is connected to a source terminal of the p-type transistor;
the first clamping diode is connected between a gate terminal and a drain terminal of the p-type transistor;
the second clamping diode is connected between the gate terminal and the source terminal of the p-type transistor; and
the bias resistor is connected between the gate terminal and ground.

6. The apparatus of claim 1, wherein:
the pass device comprises a diode, and wherein:
an anode of the diode is connected to the input/output terminal of the controller; and
a cathode of the diode is connected to the clamping switch.

7. The apparatus of claim 1, wherein:
the pass device comprises a resistor connected between the input/output terminal of the controller and the clamping switch.

8. The apparatus of claim 1, wherein:
the pass device comprises an electrostatic discharge (ESD) device.

9. The apparatus of claim 8, wherein:
the ESD device is a Zener diode, and wherein:
a cathode of the Zener diode is connected to the input/output terminal of the controller; and
an anode of the Zener diode is connected to the clamping switch.

10. The apparatus of claim 1, wherein:
the pass device comprises a conductive line connected between the clamping switch and the input/output terminal of the controller; and
the clamping switch comprises an n-type metal-oxide-semiconductor (NMOS) ESD cell.

11. The apparatus of claim 1, wherein:
the input/output terminal of the controller is a pulse width modulation (PWM) terminal of the controller, and wherein the PWM terminal is configured to receive a PWM signal from a system controller.

12. The apparatus of claim 1, wherein:
the controller is a PWM controller configured to generate a gate drive signal for controlling an average current flowing through a plurality of light emitting diodes connected in series.

13. A method comprising:
configuring a microcontroller to generate a PWM signal fed into a PWM terminal of a controller of a light emitting diode (LED) system;
detecting a fault event in the LED system; and
in response to the fault event in the LED system, clamping a logic high voltage of the PWM signal to a predetermined level through a clamping apparatus.

14. The method of claim 13, wherein the clamping apparatus comprises:
a clamping circuit configured to provide a predetermined voltage at an output of the clamping circuit;
a clamping switch coupled to the output of the clamping circuit; and
a pass device connected between the clamping switch and the PWM terminal of the controller.

15. The method of claim 14, wherein:
the clamping circuit comprises an operation amplifier, a first resistor and a second resistor, and wherein:
a non-inverting input of the operation amplifier is connected to a predetermined reference;
an inverting input of the operation amplifier is connected to a common node of the first resistor and the second resistor; and
the first resistor and the second resistor are connected in series between an output of the operation amplifier and ground, and wherein the output of the operation amplifier is the output of the clamping circuit;
the clamping switch has a gate connected to a fault logic unit configured to detect the fault event, and wherein the fault logic unit is configured such that in response to the fault event, the fault logic unit generates a signal to turn on the clamping switch; and
the pass device comprises a diode, and wherein:
an anode of the diode is connected to the PWM terminal of the controller; and
a cathode of the diode is connected to the clamping switch.

16. The method of claim 15, further comprising:
sensing the logic high voltage of the PWM signal after the fault event occurs;
comparing the logic high voltage of the PWM signal with the predetermined level; and
adjusting the predetermined reference based on a comparison result obtained in the step of comparing the logic high voltage of the PWM signal with the predetermined level, wherein as a result of adjusting the predetermined reference, the logic high voltage of the PWM signal is equal to the predetermined level under various operating conditions.

17. The method of claim 15, further comprising:
sensing the logic high voltage of the PWM signal after the fault event occurs;
comparing the logic high voltage of the PWM signal with the predetermined level; and
adjusting a gate drive voltage of the clamping switch based on a comparison result obtained in the step of comparing the logic high voltage of the PWM signal with the predetermined level, wherein as a result of adjusting the gate drive voltage of the clamping switch, the logic high voltage of the PWM signal is equal to the predetermined level under various operating conditions.

18. The method of claim 15, further comprising:
sensing the logic high voltage of the PWM signal after the fault event occurs; and
comparing the logic high voltage of the PWM signal with the predetermined level, wherein:
when the logic high voltage of the PWM signal is less than the predetermined level, reducing a gate drive voltage of the clamping switch so that the logic high voltage of the PWM signal is equal to the predetermined level; and
when the logic high voltage of the PWM signal is greater than the predetermined level, reducing the predetermined reference so that the logic high voltage of the PWM signal is equal to the predetermined level.

19. The method of claim 15, further comprising:
configuring the fault logic unit such that at least one PWM pulse of the PWM signal has two logic high levels.

20. A system comprising:
a plurality of light emitting diodes connected in series between an input voltage bus and a power switch;
a PWM controller configured to generate a gate drive signal fed into a gate of the power switch; and
a fault diagnosis circuit coupled to a PWM terminal of the PWM controller, wherein the fault diagnosis circuit comprises:
a clamping circuit configured to provide a predetermined voltage at an output of the clamping circuit;
a clamping switch coupled to the output of the clamping circuit; and
a pass device connected between the clamping switch and an input/output terminal of the PWM controller, wherein:
after the clamping switch is configured to be turned on, a current flows from the input/output terminal of the controller to the clamping circuit through the clamping switch.

21. The system of claim 20, wherein:
the clamping circuit comprises an operation amplifier, a first resistor and a second resistor, and wherein:
a non-inverting input of the operation amplifier is connected to a predetermined reference;
an inverting input of the operation amplifier is connected to a common node of the first resistor and the second resistor; and
the first resistor and the second resistor are connected in series between an output of the operation amplifier and ground, and wherein the output of the operation amplifier is the output of the clamping circuit;
the clamping switch has a gate connected to a fault logic unit configured to detect a fault event, and wherein the fault logic unit is configured such that in response to a fault event, the fault logic unit generates a signal to turn on the clamping switch; and the pass device comprises a diode, and wherein:
  an anode of the diode is connected to the input/output terminal of the PWM controller; and
  a cathode of the diode is connected to the clamping switch.

\* \* \* \* \*